United States Patent [19]

Takiguchi

[11] Patent Number: 5,187,378
[45] Date of Patent: Feb. 16, 1993

[54] PHOTODETECTOR

[75] Inventor: Tohru Takiguchi, Itami, Japan

[73] Assignee: Mitsubishi Denki Kabushiki Kaisha, Tokyo, Japan

[21] Appl. No.: 739,507

[22] Filed: Aug. 2, 1991

[30] Foreign Application Priority Data

Aug. 7, 1990 [JP] Japan .................................. 2-2111

[51] Int. Cl.⁵ .................... H01L 31/02; H01L 29/225
[52] U.S. Cl. .................................. 257/188; 257/201; 257/448
[58] Field of Search ...................... 357/30, 68, 16, 31, 357/24

[56] References Cited

U.S. PATENT DOCUMENTS

| | | | |
|---|---|---|---|
| 4,521,798 | 6/1985 | Baker | 357/31 |
| 4,791,467 | 12/1988 | Amingual et al. | 357/24 |
| 4,859,851 | 8/1989 | Wotherspoon | 357/30 |
| 4,972,244 | 11/1990 | Buffet et al. | 357/30 |

Primary Examiner—Jerome Jackson, Jr.
Attorney, Agent, or Firm—Leydig, Voit & Mayer

[57] ABSTRACT

A photodetector includes a compound semiconductor substrate including first and second elements and having a first energy band gap, a first conductivity type compound semiconductor light absorbing layer including at least one of the first and second elements and having a second energy band gap narrower than the first energy band gap, a transition layer having an energy band gap at least as wide as the second energy band gap and no wider than the first energy band gap disposed between and contacting the substrate and the light absorbing layer, at least a first recess extending through the substrate and the transition layer to the light absorbing layer, a second conductivity type region disposed in the light absorbing layer at the first recess, a first electrode disposed in the first recess in contact with the second conductivity type region, and a second electrode disposed in contact with the first conductivity type light absorbing layer.

11 Claims, 6 Drawing Sheets (PRIOR ART)

(PRIOR ART)
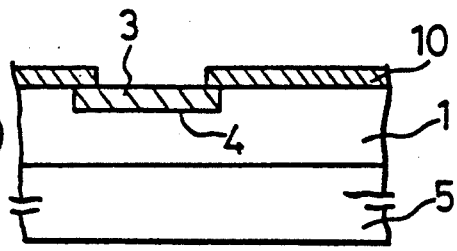
FIG. 7(e)
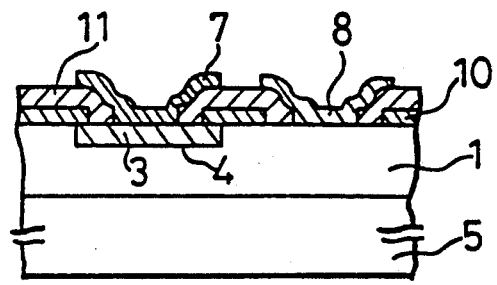
FIG. 7(f)
FIG. 8 (PRIOR ART)
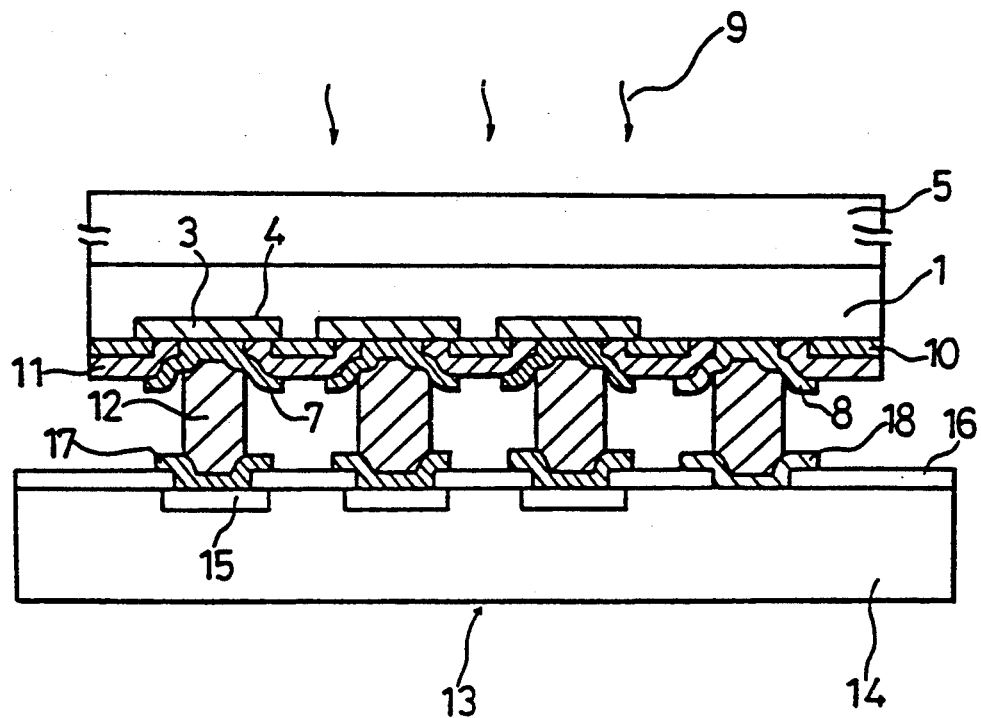

PHOTODETECTOR

FIELD OF THE INVENTION

The present invention relates to a photodetector, particularly for detecting infrared light, which has a very small surface leakage current and a method of making the photodetector.

BACKGROUND OF THE INVENTION

FIG. 6 is a cross-sectional view of a prior art photodetector for detecting infrared light that is described in Japanese Published Patent Application 1-246878. The photodetector of FIG. 6 includes a light absorbing layer 1 of cadmium mercury telluride ($Cd_xHg_{1-x}Te$) disposed on a cadmium telluride (CdTe) substrate 5. A doped region 3 at a surface of the $Cd_xHg_{1-x}Te$ layer 1 remote from the substrate 5 forms a pn junction 4 within that layer 1. An electrode 7 is in contact with the doped region 3 and an electrode 8 is in contact with the undoped portion of the light absorbing layer 1. Spaced apart regions 10 of $Cd_xHg_{1-x}Te$ are disposed on the surface of the $Cd_xHg_{1-x}Te$ light absorbing layer 1, partially overlying respective doped regions 3, and are electrically insulated from the electrodes 7 and 8 by intervening insulating layers 11.

Typically, infrared photodetectors of the type shown in FIG. 6 are operated at a reduced temperature, such as liquid nitrogen temperature (77° K.), for detecting infrared light in the ten micron band, i.e., light having wavelengths from approximately eight microns to approximately twelve microns. Incident infrared light 9 passes through the wider band gap substrate 5 and reaches the narrower band gap light absorbing layer 1 where the light is absorbed, thereby producing charge carriers that are collected as a photocurrent through the electrodes 7 and 8.

FIGS. 7(a)-7(f) illustrate a method of making the prior art photodetector of FIG. 6. As shown in FIG. 7(a), a p-type $Cd_xHg_{1-x}Te$ light absorbing layer 1, where x=0.2, is grown on a substrate 5 of CdTe. In addition, a thin p-type semiconductor layer 10 of $Cd_xHg_{1-x}Te$ where x=0.3, is grown on the semiconductor layer 1. The semiconductor layers 1 and 10 are grown by conventional techniques, such as metal organic chemical vapor deposition (MOCVD) or liquid phase epitaxy (LPE). Because the semiconductor layer 10 has a proportionally larger cadmium content than the light absorbing layer 1, it has a wider energy band gap than the layer 1.

As illustrated in FIG. 7(b), an aperture is opened in the semiconductor layer 10 exposing the light absorbing layer 1. Thereafter, a zinc sulfide (ZnS) layer (not shown) is deposited to a thickness of about one micron on the light absorbing layer 1. An etching mask 20 having an aperture larger than the aperture in the semiconductor layer 10 and encompassing the aperture in the layer 10 is then formed by conventional photolithographic techniques.

The n-type region 3 in the light absorbing layer 1 is formed by the diffusion or ion implantation of dopant impurities into the light absorbing layer 1 to produce the pn junction 4. Because the aperture in the mask 20 is larger than the aperture in the semiconductor layer 10, a narrow n-type doped region 10a within the aperture in the mask 20 is formed in the semiconductor layer 10, as shown in FIG. 7(d). Subsequently, the mask 20 and the doped region 10a in the semiconductor layer 10 are removed to produce the structure shown in FIG. 7(e).

Finally, the device structure is completed, as shown in FIG. 7(f), by depositing the insulating film 11, opening a first aperture in the insulating film 11 at the doped region 3 and a second aperture in the insulating film 11 spaced from the doped region 3, and forming the electrodes 7 and 8 in the respective apertures.

One of the most important characteristics of any photodetector is the magnitude of the dark current, i.e., the current that flows through the biased photodetector when no infrared light is incident on the photodetector. The dark current is a kind of noise. A small dark current indicates low noise and a high quality photodetector with a high signal-to-noise (S/N) ratio. In an ideal photodetector, i.e., photodiode, the dark current is limited by the diffusion of charge carriers or the recombination of charge carriers in the depletion region at the pn junction. However, in an actual photodetector, additional currents are present that contribute to the total dark current. For example, leakage current flows along exposed surfaces of the photodetector's pn junction, increasing the dark current and decreasing the S/N ratio.

In the photodetector of FIG. 6, the wider energy band gap semiconductor layer 10 is disposed on the surface of the light absorbing layer 1, covering the pn junction at the surface of the light absorbing layer 1 in order to reduce the surface leakage current. In the specific embodiment of the photodetector described with respect to FIG. 6, the energy band gap of the light absorbing layer 1 is about 0.12 eV and the energy band gap of the semiconductor layer 10 is 0.25 eV. At an operating temperature of 77° K., the surface leakage current is reduced by a factor of $10^4$ over a similar structure lacking the semiconductor layer 10.

FIG. 8 shows a schematic cross-sectional view of an imaging device including a photodetector having the structure of FIG. 6 and a charge transfer circuit incorporating a charge coupled device (CCD) 13. In all figures, the same reference numbers designate the same or corresponding elements. In FIG. 8, the charge transfer circuit includes a p-type silicon substrate 14 in which a plurality of n-type regions 15 are produced. An electrically insulating film 16 on the substrate 14 includes apertures providing access to the n-type regions 15 and to the substrate 14. Electrodes 17 are disposed in each of the apertures in the insulating film 16 where an n-type region 15 is present. An electrode 18 is disposed in an aperture in the electrically insulating film 16 where the p-type substrate 14 is exposed. Masses 12 of indium are disposed between and provide electrical connections between respective pairs of electrodes 7 and 17 and electrodes 8 and 18 of the photodetector and CCD 13. Infrared light 9 is incident on the rear side of the substrate 5, passes through the substrate 5 with little absorption, and is absorbed in the light absorbing layer 1, producing charge carriers that are collected by the respective electrodes 7 and 8 as photocurrents. The photocurrents are conducted to the CCD 13 and supplied by the CCD 13 as an output signal representing an image of the incident light.

In the photodetector structure of FIG. 6, the semiconductor layer 10 must be relatively thin. In addition, the requirement of growing two layers, i.e., layers 1 and 10, of different energy band gaps increases the complexity of the fabrication process. The difficulty of growing a very thin layer and controlling a change in energy band gap reduces the yield of acceptable photodetectors made by the process illustrated in FIGS. 7(a)-7(f). Moreover, in providing access through the layer 10 to the semiconductor layer 1, a non-planar surface must be prepared. The lack of a planar surface increases the probability that the insulating film 11 may peel off the layers 1 and 10 and increases the difficulty of interconnecting the photodetector structure with the CCD 13 employing the masses 12 of indium. The non-planar surface can result in the formation of voids when the indium masses are formed by vapor deposition and a lift-off step. Since the CCD 13 is attached to the photodetector bearing the indium masses 12 by compressing the photodetector and the CCD 13, it is less important that the electrodes 17 and 18 of the CCD 13 be planar than that the electrodes 7 and 8 be planar.

SUMMARY OF THE INVENTION

The present invention is directed to solving the above-described problems. An important objective of the invention is to provide a photodetector structure in which surface leakage currents are suppressed and that includes only one grown layer absorbing incident infrared light.

It is another important objective of the invention to provide a method of making a photodetector structure in which surface leakage currents are suppressed and in which only one layer absorbing incident infrared light needs to be grown.

It is a further object of the invention to provide a photodetector structure and method of making the photodetector structure in which surface leakage current is reduced and including planar electrodes for easy connection of the photodetector to other circuitry with bump electrodes, such as indium masses.

According to one aspect of the invention, a photodetector includes a compound semiconductor substrate comprising first and second elements and having a first energy band gap, a first conductivity type compound semiconductor light absorbing layer comprising at least one of the first and second elements and having a second energy band gap narrower than the first energy band gap, a transition layer having an energy band gap at least as wide as the second energy band gap and no wider than the first energy band gap disposed between and contacting the substrate and the light absorbing layer, at least a first recess extending through the substrate and the transition layer to the light absorbing layer, a second conductivity type region disposed in the light absorbing layer at the first recess, a first electrode disposed in the first recess in contact with the second conductivity type region, and a second electrode disposed in contact with the first conductivity type light absorbing layer.

According to another aspect of the invention, a method of making a photodetector includes forming a first conductivity type semiconductor light absorbing layer having a first energy band gap on a semiconductor substrate having a second energy band gap wider than the first energy band gap and including first and second elements at an elevated temperature so that one of the first and second elements diffuses from the substrate into the light absorbing layer and forms a transition layer between the substrate and the light absorbing layer having an energy band gap at least as wide as the first energy band gap and no wider than the second energy band gap, forming a first recess extending through the substrate and transition layer to the light absorbing layer, forming a second conductivity type region in the light absorbing layer at the recess, forming a first electrode in the recess in contact with the second conductivity type region, and forming a second electrode in contact with the first conductivity type light absorbing layer.

Other objects and advantages of the present invention will become apparent from the detailed description given hereinafter. The detailed description and specific embodiments are provided for illustration only, since various additions and modifications within the spirit and scope of the invention will become apparent to those of skill in the art from the detailed description.

BRIEF DESCRIPTION OF THE DRAWINGS

FIGS. 7(a)-7(f) are cross-sectional views illustrating a method of making the photodetector of FIG. 6.

FIG. 8 is a cross-sectional view of an imaging structure incorporating the photodetector of FIG. 6, all in accordance with the prior art.

DETAILED DESCRIPTION OF PREFERRED EMBODIMENTS

Figure 1:
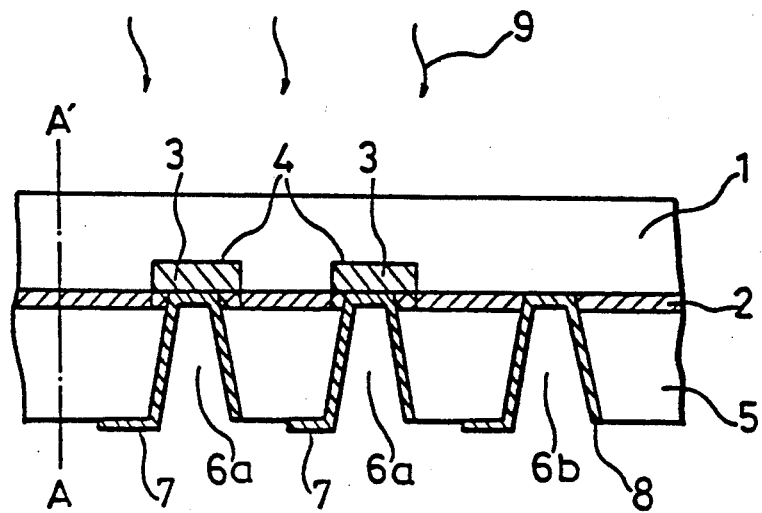
FIG. 1 is a cross-sectional view showing the structure of an embodiment of a photodetector according to the invention.

FIG. 1 is a cross-sectional view of an infrared light photodetector in accordance with an embodiment of the invention. In FIG. 1, the CdTe substrate 5 has a light absorbing layer 1 of $Cd_xHg_{1-x}Te$ disposed on it with a transition layer 2 intervening between the substrate 5 and the layer 1. The photodetector includes two n-type regions 3 disposed within parts of the transition layer 2 and the light absorbing layer 1. Respective recesses 6a extend through the substrate 5 to corresponding doped regions 3. A respective electrode 7 is disposed on the substrate 5 within each of the recesses 6a and is in contact with a respective doped region 3. A substantially planar portion of each electrode 7 is disposed on the front surface of the substrate 5, i.e., opposite the $Cd_xHg_{1-x}Te$ light absorbing layer 1. Another recess 6b extends through the substrate 5 and transition layer 2 to the light absorbing layer 1. An electrode 8 is disposed in the recess 6b in contact with the light absorbing layer 1. A substantially planar portion of the electrode 8 is disposed on the front surface of the substrate 5.

Figure 2:
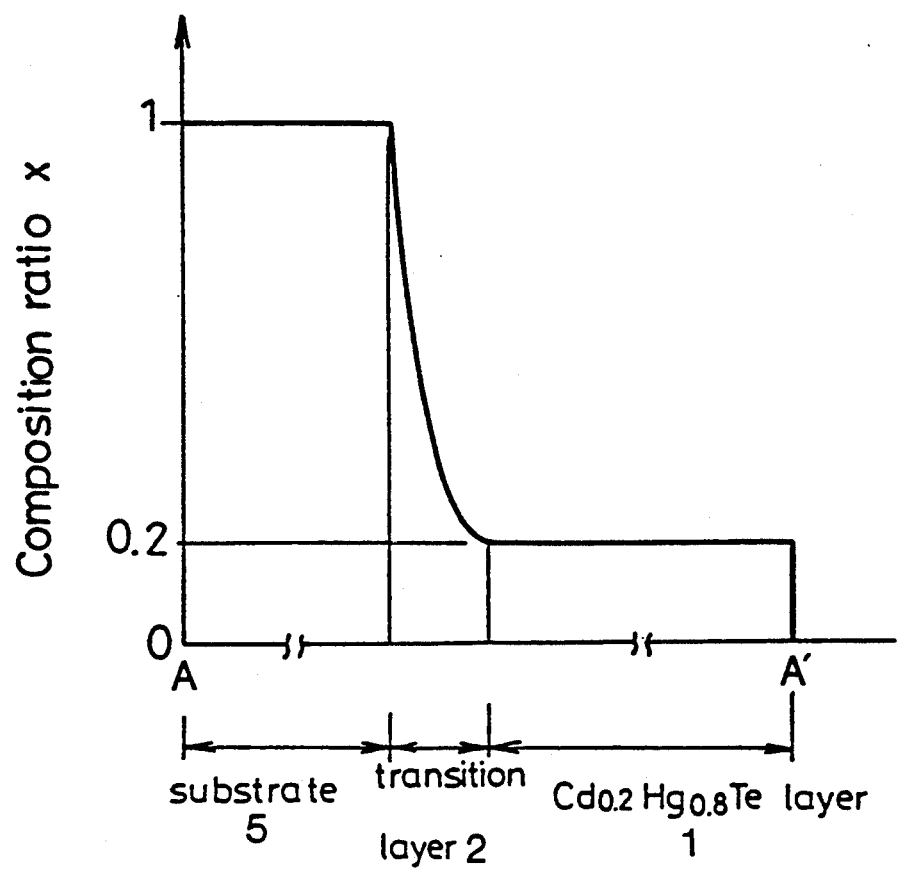
FIG. 2 is a graph showing the distribution of x in $Cd_xHg_{1-x}Te$ along line A—A' of FIG. 1.

An important feature of the invention is the transition layer 2 in which the proportions of cadmium and mercury vary as a function of position in the thickness direction, i.e., between the substrate 5 and the light absorbing layer 1. That variation is shown in FIG. 2 which is a graph of the proportion of cadmium as a function of position taken along line A—A, of FIG. 1 through the substrate 5, the transition layer 2, and the light absorbing layer 1. As shown in FIG. 2, substrate 5 is CdTe, i.e., $Cd_xHg_{1-x}Te$, in which $x=1$. The light absorbing layer 1 is also $Cd_xHg_{1-x}Te$ in which x has a fixed value, for example, 0.2. In the transition layer 2, the value of x gradually changes from 1 to 0.2 from the substrate 5 to the light absorbing layer 1.

Figure 3A:
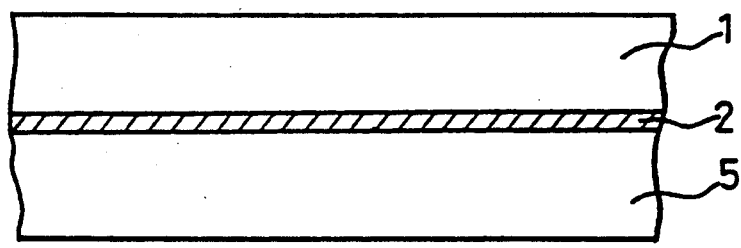
FIGS. 3(a)-3(e) are cross-sectional views illustrating a method of making a photodetector in accordance with the invention.

A method of manufacturing the photodetector of FIG. 1 is illustrated in the steps of FIGS. 3(a)-3(e). Initially, a substrate of CdTe about five hundred microns in thickness has grown upon it a light absorbing layer 1 of p-type $Cd_{0.2}Hg_{0.8}Te$ to a thickness of about twenty microns. The growth process is carried out at a relatively high temperature, for example, about 480° C., for a sufficient time, for example, about forty minutes, so that cadmium atoms diffuse from the substrate 5 toward the light absorbing layer 1 at the interface of the substrate and the light absorbing layer 1 during the growth process. In that way, the transition layer 2 is produced during the growth process and, for example, has a thickness of about two to three microns. The grown structure is shown in FIG. 3(a).

Figure 3B:
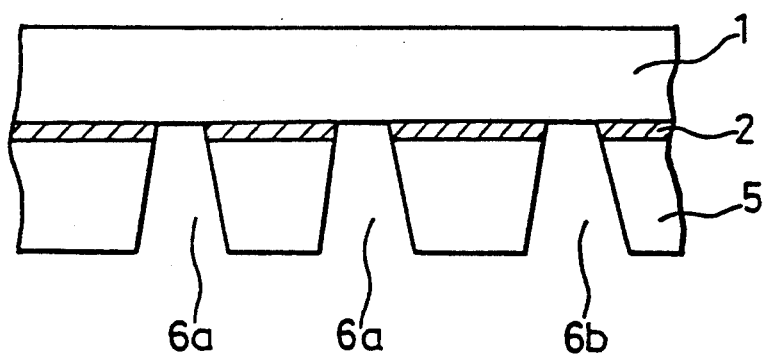
Figure 3C:
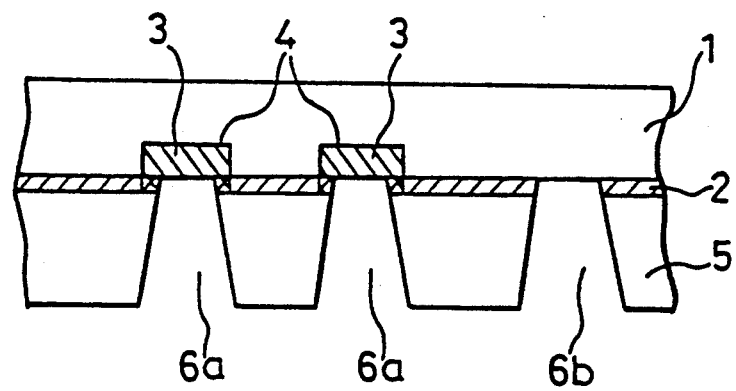
Figure 3D:
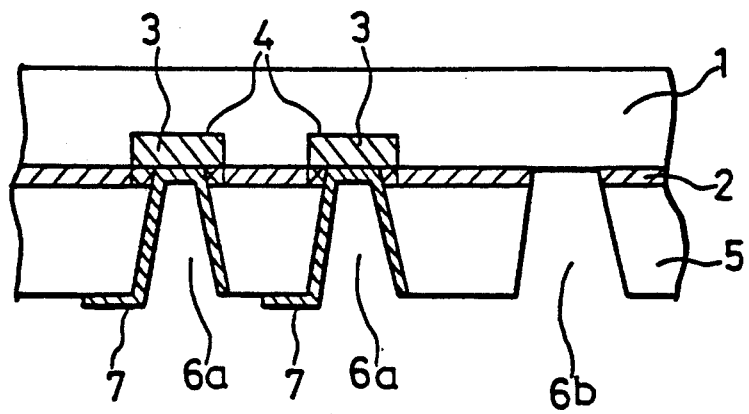

After completion of the growth process, as shown in FIG. 3(b), the recesses 6a and 6b are formed penetrating through the substrate 5 and the transition layer 2 to expose the light absorbing layer 1. Preferably, the recesses are formed by ion milling or another dry etching process, although the recesses 6a and 6b can also be formed by wet etching. After the formation of the recesses 6a, n-type regions 3 of FIG. 3(c) are formed in the semiconductor layer 1 by ion implantation, for example, of boron, or by diffusion of a dopant impurity producing n-type conductivity, such as mercury or indium.

Figure 3E:
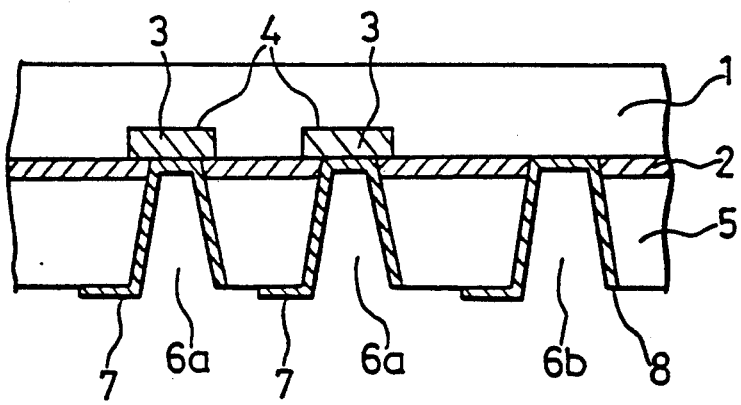

Thereafter, electrodes are applied to the structure. The electrodes 7 of FIG. 3(d) making contact to the n-type regions 3 are prepared by depositing a metal, such as chromium, in each of the recesses 6a and partially on the front surface of the substrate 5, i.e., the surface opposite the light absorbing layer 1. A p side electrode 8 is formed by depositing gold in the recess 6b, as shown in FIG. 3(e). The electrode 8 contacts the light absorbing layer 1 in recess 6b where no n-type region or pn junction has been formed.

Figure 4:
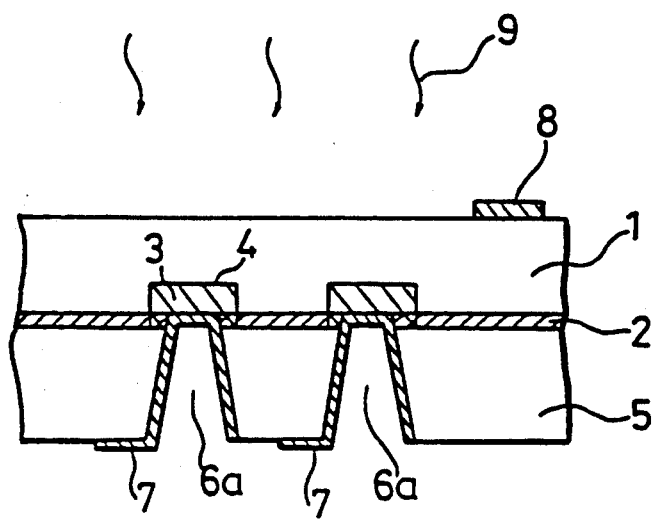
FIG. 4 is a cross-sectional view illustrating an alternative embodiment of a photodetector according to the invention.

Alternatively, the gold electrode 8 may be disposed directly on the rear surface, i.e., the light incident surface, of the photodetector. Such a structure is shown in FIG. 4 in which the electrode 8 is directly disposed on the grown surface of the light absorbing layer 1. In the alternative process, the step of FIG. 4 replaces the step of FIG. 3(f).

In the photodetector of FIG. 1, the substrate 5 has a relatively large energy band gap and the transition layer 2 has an energy band gap intermediate the energy band gaps of the substrate 5 and the light absorbing layer 1. In fact, the transition layer 2 has essentially the same energy band gap as the substrate 5 at the interface with the substrate 5 and has essentially the same energy band gap as the light absorbing layer 1 at the interface with the light absorbing layer 1. When infrared light 9 is incident on the rear surface of the photodetector, i.e., directly on the light absorbing layer 1, the light is absorbed and produces electron-hole pairs. Those charge carriers that reach one of the pn junctions 4 are collected and produce a photocurrent. Because the light absorbing layer 1 is relatively thick, almost all of the incident infrared radiation that can be absorbed in that layer is successfully absorbed and very little of the incident infrared light is left for possible absorption in the transition layer 2.

Figure 6:
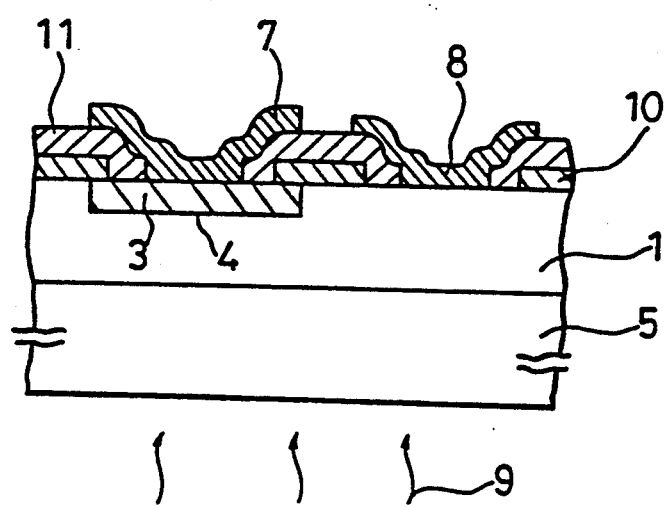
FIG. 6 is a cross-sectional view of a prior art photodetector.
Figure 7A:
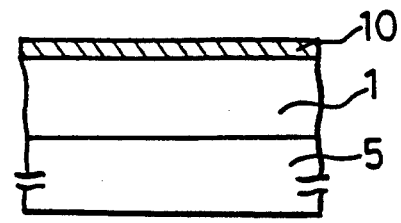
Figure 7B:
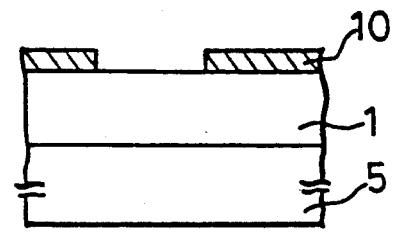
Figure 7C:
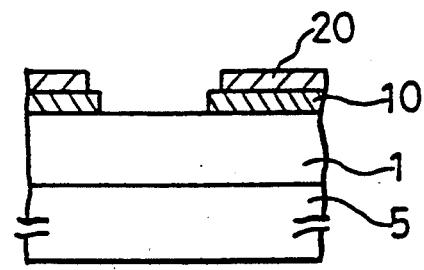
Figure 7D:
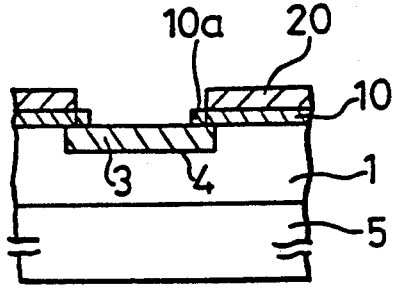

In the photodetector of FIG. 1, the pn junctions 4 are not exposed at any surface. Moreover, those pn junctions 4 intersect the transition layer 2 which, on average, has a wider energy band gap than the light absorbing layer 1, thereby significantly reducing surface current leakage just as in the prior art photodetector of FIG. 6. In addition, the relatively wide energy band gap transition layer 2 is not the result of a separate growth step as in the photodetector of FIG. 6 but is the natural product of the growth process when the light absorbing layer 1 is grown on the substrate 5. Therefore, defects that can occur at an interface between semiconductor layers grown in different steps cannot occur in the invention and contribute to surface current leakage. Moreover, no special growth condition controls are required to produce a thin layer with one energy band gap and a thicker layer of a different energy band gap.

Figure 5:
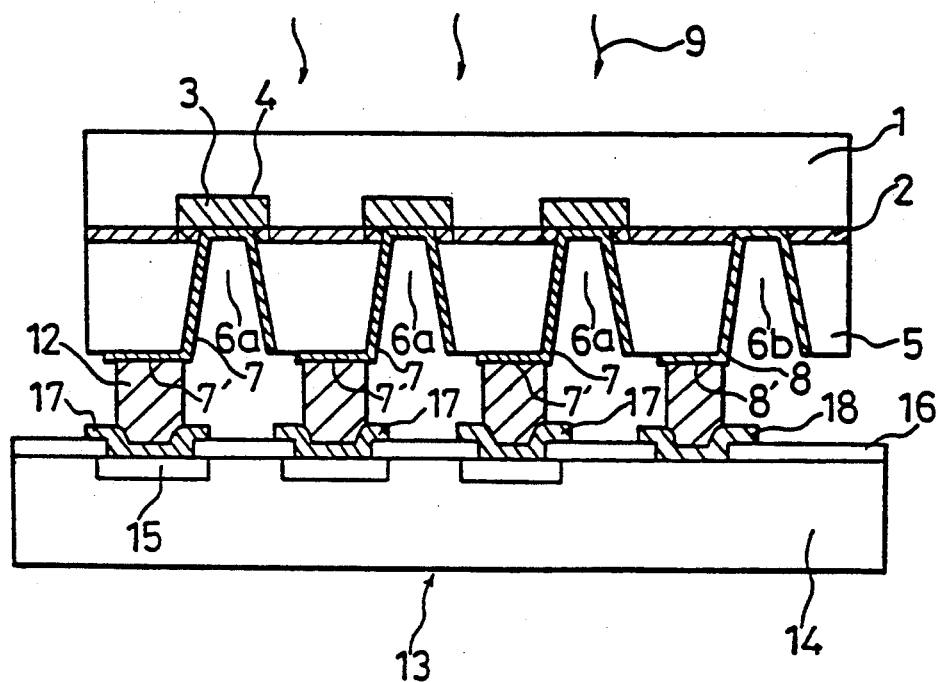
FIG. 5 is a cross-sectional view of an imaging structure incorporating an embodiment of a photodetector according to the invention.

In FIG. 5, a cross-sectional schematic view of an imaging device incorporating a photodetector according to the invention is shown. Each of the electrodes 7 and 8 includes a respective substantially planar portion 7' and 8' that extends onto the front side of the photodetector. These planar portions of the electrodes are employed to provide bases for the indium masses 12 that are used as bump electrodes interconnecting the photodetector to the CCD 13, as shown in FIG. 5. Because these electrode portions are planar, the formation of the bump electrodes 12 and their interconnection to the CCD 13 is simplified as compared to the prior art structures of FIGS. 6 and 8.

Although a photodetector structure including materials particularly useful in detecting infrared light has been described in detail, the invention is not limited to the specific materials described nor to the detection of any particular wavelength of light. An important feature of the invention is a compound semiconductor light absorbing layer having a narrower energy band gap than the energy band gap of a substrate on which the layer is disposed and an intermediate transition layer having an intermediate energy band gap and formed by the diffusion of an element of the compound semiconductor substrate into the growing layer during the growth process. This feature is independent of the specific materials used in an embodiment of the invention. In place of the materials of the specific embodiment described, a substrate of cadmium zinc telluride (CdZnTe) and a light absorbing layer of CdTe could be used. The invention can also be applied to photodetectors made of III-V compound semiconductor materials, such as gallium arsenide (GaAs) and indium gallium arsenide (InGaAs).

I claim:

1. A photodetector comprising:

a compound semiconductor substrate comprising first and second elements and having a first energy band gap;

a first conductivity type compound semiconductor light absorbing layer comprising at least one of the first and second elements and having a second energy band gap narrower than the first energy band gap;

a transition layer having an energy band gap at least as wide as the second energy band gap and no wider than the first energy band gap disposed between and contacting the substrate and the light absorbing layer;

at least a first recess extending through the substrate and the transition layer to the light absorbing layer;

a second conductivity type region disposed in the light absorbing layer at the first recess;

a first electrode disposed in the first recess in contact with the second conductivity type region; and a second electrode disposed in contact with the first conductivity type light absorbing layer.

2. The photodetector of claim 1 wherein the first electrode includes a substantially planar portion disposed on the substrate.

3. The photodetector of claim 1 including a second recess extending through the substrate and transition layer to the first conductivity type light absorbing layer in which the second electrode is disposed.

4. The photodetector of claim 3 wherein the second electrode includes a substantially planar portion disposed on the substrate.

5. The photodetector of claim 1 including a plurality of second conductivity type regions disposed in the light absorbing layer, respective recesses extending through the substrate and the transition layer to the respective second conductivity type regions, and a plurality of first electrodes disposed in respective recesses contacting the respective second conductivity type regions.

6. The photodetector of claim 1 wherein the second electrode is disposed on the light absorbing layer opposite the substrate.

7. The photodetector of claim 1 wherein the first element is cadmium, the second element is tellurium, and the light absorbing layer is cadmium mercury telluride.

8. The photodetector of claim 7 wherein the light absorbing layer is p-type and the second conductivity type region contains boron, providing the n-type conductivity.

9. The photodetector of claim 7 wherein the light absorbing layer is p-type and the second conductivity type region contains one of indium and mercury as a dopant impurity providing the n-type conductivity.

10. The photodetector of claim 1 wherein the concentration of one of the first and second elements in the transition layer varies between the substrate and the light absorbing layer.

11. The photodetector of claim 1 wherein the light absorbing layer is formed on the substrate at an elevated temperature and the transition layer is formed during the formation of the light absorbing layer by diffusion of one of the first and second elements from the substrate into the forming light absorbing layer.

* * * * *